(12) United States Patent
Cideciyan et al.

(10) Patent No.: US 7,432,834 B1
(45) Date of Patent: Oct. 7, 2008

(54) RLL ENCODING FOR LTO-5 TAPE

(75) Inventors: Roy D. Cideciyan, Rueschlikon (CH);
Paul J. Seger, Tucson, AZ (US);
Keisuke Tanaka, Tokyo-to (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/773,821

(22) Filed: Jul. 5, 2007

(51) Int. Cl.
*H03M 7/00* (2006.01)
(52) U.S. Cl. .......................................... 341/59; 341/50
(58) Field of Classification Search ............... 341/50–70
See application file for complete search history.

(56) References Cited

U.S. PATENT DOCUMENTS

| | | | |
|---|---|---|---|
| 5,537,424 A * | 7/1996 | Karabed et al. | 714/795 |
| 5,781,133 A * | 7/1998 | Tsang | 341/59 |
| 6,223,322 B1 * | 4/2001 | Michigami et al. | 714/769 |
| 6,995,694 B1 * | 2/2006 | He et al. | 341/58 |
| 7,002,492 B2 * | 2/2006 | Tsang et al. | 341/58 |
| 2007/0205933 A1 * | 9/2007 | Coene et al. | 341/155 |

* cited by examiner

*Primary Examiner*—Lam T Mai
(74) *Attorney, Agent, or Firm*—Dan Shifrin

(57) ABSTRACT

Method and apparatus are provided for encoding and decoding rate-$(s(K+1)/s(K+1)+1)$ TCMTR(j,k,t,a) codes, where s is the ECC symbol size in bits and K is the number of unencoded symbols that are interleaved with an $(s+1)$-bit encoded block at the output of a rate-$s/(s+1)$ encoder that encodes the r-th s-bit symbol. $K=m/s-1$ where $m=s(K+1)$ is the total number of bits to be encoded. Error propagation is reduced, thus allowing the ECC code to correct errors efficiently. Header error-rate is also reduced by eliminating occurrence of likely error events at the detector output. Although initially an RLL code may be designed for an ECC symbol size of s bits, the RLL encoding of the present invention may be used in conjunction with ECC schemes that utilize symbol sizes other than s bits.

8 Claims, 11 Drawing Sheets

TABLE III

| | | | | | | | |
|---|---|---|---|---|---|---|---|
| 000100001 | 001001100 | 010001001 | 010101110 | 011100101 | 100101010 | 101011001 | 110100100 |
| 000100010 | 001001101 | 010001010 | 010110001 | 011101000 | 100101011 | 101011010 | 110100101 |
| 000100011 | 001001110 | 010001011 | 010110010 | 011101001 | 100101100 | 101011011 | 110100110 |
| 000100100 | 001010001 | 010001100 | 010110011 | 011101010 | 100101101 | 101100010 | 110100111 |
| 000100101 | 001010010 | 010001101 | 010110100 | 011101011 | 100101110 | 101100100 | 110101000 |
| 000100110 | 001010011 | 010001110 | 010110101 | 100000100 | 100110100 | 101100101 | 110101001 |
| 000100111 | 001010100 | 010010001 | 010110110 | 100000101 | 100110101 | 101101000 | 110101010 |
| 000101000 | 001010101 | 010010010 | 010110111 | 100001000 | 100111010 | 101101001 | 110101011 |
| 000101001 | 001010110 | 010010011 | 010111000 | 100001001 | 101000001 | 101101010 | 110101100 |
| 000101010 | 001010111 | 010010100 | 010111001 | 100001010 | 101000010 | 101101011 | 110101101 |
| 000101011 | 001011000 | 010010101 | 010111010 | 100001011 | 101000011 | 101101100 | 110101110 |
| 000101100 | 001011001 | 010010110 | 010111011 | 100010001 | 101000100 | 110000010 | 110110010 |
| 000101101 | 001011010 | 010010111 | 011000100 | 100010010 | 101000101 | 110000100 | 110110100 |
| 000101110 | 001011011 | 010011000 | 011001000 | 100010011 | 101000110 | 110000101 | 110110101 |
| 000110100 | 001011100 | 010011001 | 011001001 | 100010100 | 101000111 | 110001000 | 111000100 |
| 000110101 | 001011101 | 010011010 | 011001010 | 100010101 | 101001000 | 110001001 | 111001000 |
| 000111010 | 001011110 | 010011011 | 011001011 | 100010110 | 101001001 | 110001010 | 111001001 |
| 001000001 | 001100010 | 010100001 | 011001100 | 100010111 | 101001010 | 110001011 | 111001010 |
| 001000010 | 001100100 | 010100010 | 011001101 | 100011010 | 101001011 | 110010001 | 111001011 |
| 001000011 | 001100101 | 010100011 | 011001110 | 100011011 | 101001100 | 110010010 | 111010001 |
| 001000100 | 001101000 | 010100100 | 011010001 | 100100001 | 101001101 | 110010011 | 111010010 |
| 001000101 | 001101001 | 010100101 | 011010010 | 100100010 | 101001110 | 110010100 | 111010011 |
| 001000110 | 001101010 | 010100110 | 011010011 | 100100011 | 101010001 | 110010101 | 111010100 |
| 001000111 | 001101011 | 010100111 | 011010100 | 100100100 | 101010010 | 110010110 | 111010101 |
| 001001000 | 010000001 | 010101000 | 011010101 | 100100101 | 101010011 | 110010111 | 111010110 |
| 001001001 | 010000010 | 010101001 | 011010110 | 100100110 | 101010100 | 110011010 | 111010111 |
| 001001010 | 010000011 | 010101010 | 011010111 | 100100111 | 101010101 | 110011011 | 111011000 |
| 001001011 | 010000100 | 010101011 | 011100010 | 100101000 | 101010110 | 110100001 | 111011010 |
| 001001100 | 010000101 | 010101100 | 011100011 | 100101001 | 101010111 | 110100010 | |
| 001001101 | 010000110 | 010101101 | 011100100 | | 101011000 | 110100011 | |

FIG. 8

TABLE IV

| 00010111 | 00100111 | 01000111 | 01011001 | 01101101 | 01110101 | 10100111 | 10101010 | 11010001 |
|----------|----------|----------|----------|----------|----------|----------|----------|----------|
| 00011100 | 00110101 | 01010101 | 01100001 | 01110001 | 10010111 | 11000110 | 11010111 | 11011001 |

FIG. 9

TABLE V

| 00010000 | 00101000 | 01000000 | 01010000 | 01011000 | 01101000 | 10000000 | 10101000 | 11010000 |
|----------|----------|----------|----------|----------|----------|----------|----------|----------|
| 00100000 | 00110101 | 01000100 | 01010000 | 01100000 | 10000100 | 10100000 | 11000100 | 11100000 |

FIG. 10

TABLE VI 010101011 100000010 100000111 100001110 100011011 100110010 100110111 100111011
100000001 100000110 100001101 100011000 100110001 100110110 100111000 101100011

FIG. 11

TABLE VII 000000010 000000101 000001001 000001011 000010010 000010100 000010110 000011010
000000100 000001000 000001010 000010001 000010011 000010101 000010111 000110010

FIG. 12

RLL ENCODING FOR LTO-5 TAPE

RELATED APPLICATION DATA

The present application is related to commonly-assigned and co-pending U.S. application Ser. No. 11/749,711 filed May 16, 2007 and entitled HIGH-RATE RLL ENCODING, which application is incorporated herein by reference in its entirety.

TECHNICAL FIELD

The present invention relates generally to RLL encoding and, in particular, to encoding a data input sequence using rate-$s(K+1)/(s(K+1)+1)$ TCMTR(j,k,t,a) codes.

BACKGROUND ART

Runlength-limited (RLL) codes have been widely used in magnetic and optical data storage to eliminate sequences that are undesired for the processes of recording and reproducing digital data. Various classes of RLL codes are used in practice. For example, peak detection systems employing runlength-limited RLL(d,k) constrained codes such as rate-1/2 RLL(2,7) and rate-2/3 RLL(1,7) codes have been predominant in digital magnetic storage at low normalized linear densities. At moderate normalized linear densities, the introduction of partial-response maximum-likelihood (PRML) detection channels into data storage required a different type of constrained codes. This class of codes, which are known as PRML)G,I) codes, facilitates timing recovery and gain control and limits the path memory length of the sequence detector, and therefore the decoding delay, without significantly degrading detector performance.

Noise-predictive maximum likelihood (NPML) channels in magnetic recording, which generalize the PRML concept, have detector targets with spectral nulls at DC and/or the Nyquist frequency $1/(2T)$. Therefore PRML(G,I) codes in conjunction with $1/(1 \oplus D^2)$ precoders can also be used in NPML channels. PRML(G,I) codes may also satisfy a VFO constraint, which is also known as the M constraint at the input of a $1/(1 \oplus D^2)$ precoder. The VFO constraint allows discrimination of encoded data from the synchronization preamble and fast start-up of the PRML receiver. This class of RLL codes satisfying G, I and M constraints are known as PRML(G,I,M) codes. The recorded VFO pattern . . . ++−−++−− . . . is received as a tone with frequency $1/(4T)$ at the center of the channel. The concept of excluding data patterns with spectral component at $1/(4T)$, namely the VFO constraint or M constraint at the input of a $1/(1 \oplus D^2)$ precoder, was generalized by the introduction of anti-whistle codes that exclude data patterns with zero or one spectral component in the frequency band $(0, 1/(2T))$.

Error-correction coding (ECC) algorithms are often described using finite-field arithmetic. Finite fields have n elements where n is a power of a prime number. Finite fields were invented by Galois and therefore are also known as Galois fields (GF). As used herein, "GF(n)" denotes a Galois field with n elements. The RLL code parameter that is most critical to determining error-rate performance in the presence of ECC is error propagation. Two-way interleaved Reed-Solomon (RS) encoding over GF(16) (where ECC symbol size is s=4 bits or one nibble) have been proposed to increase robustness of headers in a codeword quad (LTO 4) or in a synchronized codeword object (LTO 5) without increasing header redundancy. As almost all of the random error patterns at the detector output are 2 to 5 NRZI bits long (short error bursts of non-fading type), error propagation is defined herein as the maximum number of erroneous symbols in a RS codeword that is caused by a channel error burst not longer than 5 NRZI bits. In general, the header RLL scheme and the header RS-encoding scheme should be selected such that a likely error event in the channel can only give rise to at most one erroneous symbol per RS codeword. There remains a need for a RLL design which minimizes error propagation.

SUMMARY OF THE INVENTION

The present invention provides a method for encoding and decoding rate-$(s(K+1)//s(K+1)+1)$ TCMTR(j,k,t,a) codes, where s is the ECC symbol size in bits and K is the number of unencoded symbols that are interleaved with an $(s+1)$-bit encoded block at the output of a rate-$s/(s+1)$ encoder that encodes the r-th s-bit symbol. Note that $K=m/s-1$ where $m=s(K+1)$ is the total number of bits to be encoded. Error propagation is reduced, thus allowing the ECC code to correct errors efficiently. The present invention also provides a method for encoding in which header error-rate is reduced by eliminating occurrence of likely error events at the detector output.

Although initially an RLL code may be designed for an ECC symbol size of s bits, the RLL encoding of the present invention may be used in conjunction with ECC schemes that utilize symbol sizes other than s bits.

BRIEF DESCRIPTION OF THE DRAWINGS

FIG. 8 is listing of TABLE III;
FIG. 9 is listing of TABLE IV;
FIG. 10 is listing of TABLE V;
FIG. 11 is listing of TABLE VI;
FIG. 12 is listing of TABLE VII.

DETAILED DESCRIPTION OF THE PREFERRED EMBODIMENT

Figure 1:
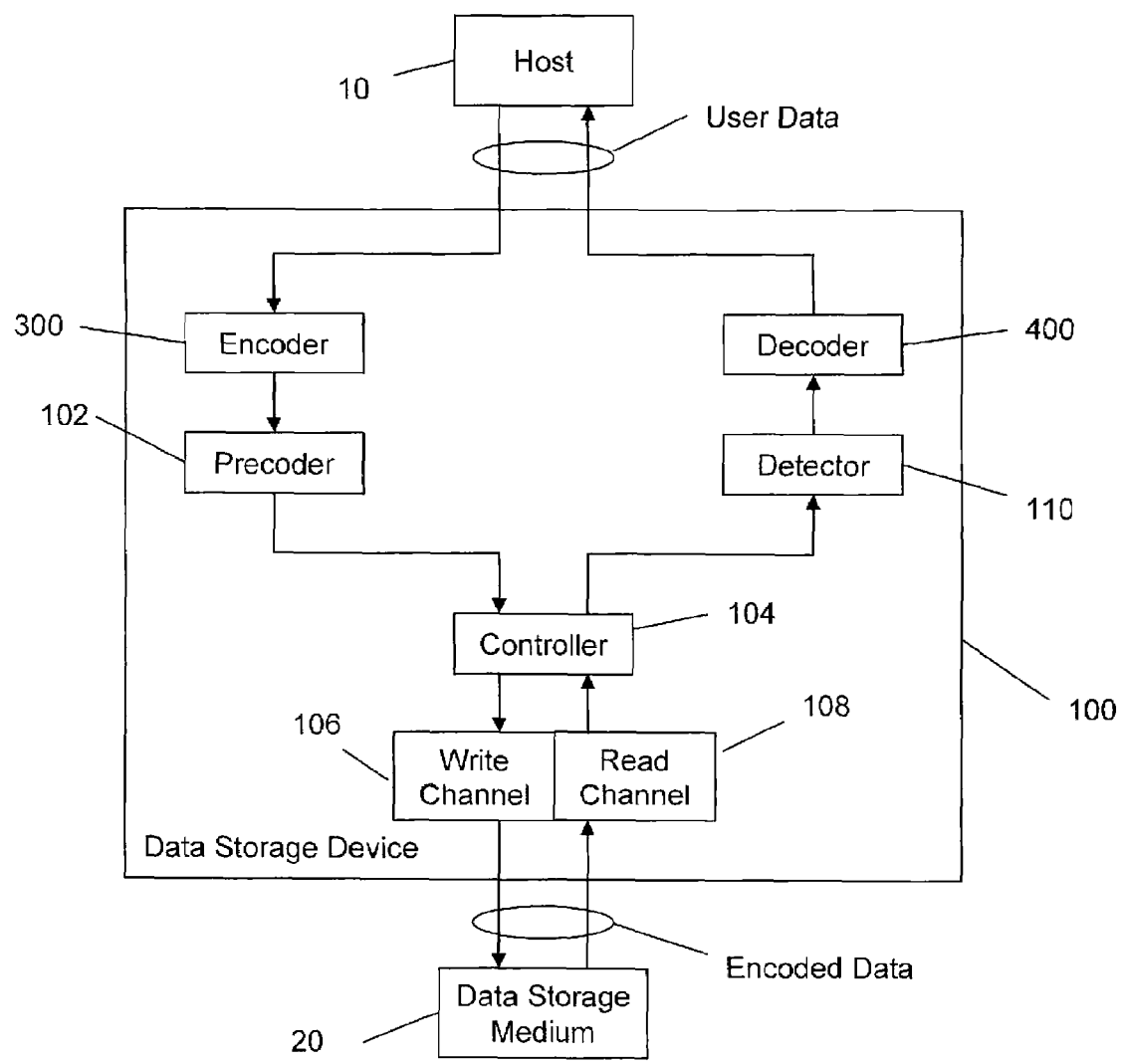
FIG. 1 is a high level block diagram of a data storage device in which the present invention may be implemented.

Many of the functional units described in this specification have been labeled as modules or components, in order to more particularly emphasize their implementation independence. For example, a module may be implemented as a hardwire circuit comprising custom VLSI circuits or gate arrays, off-the-shelf semiconductors such as logic chips, transistors, or other discrete components. A component may also be implemented in programmable hardware devices such as field programmable gate arrays, programmable array logic, programmable logic devices or the like.

Components may also be implemented in software for execution by various types of processors. An identified component of executable code may, for instance, comprise one or more physical or logical blocks of computer instructions which may, for instance, be organized as an object, procedure or function. Nevertheless, the executables of an identified component need not be physically located together but may comprise disparate instructions stored in different locations which, when joined logically together, comprise the component and achieve the stated purpose for the component.

Indeed, a component of executable code could be a single instruction, or many instructions, and may even be distributed over several different code segments, among different programs and across several memory devices. Similarly, operational data may be identified and illustrated herein within component, and may be embodied in any suitable form and organized within any suitable type of data structure. The operational data may be collected as a single data set, or may be distributed over different locations including over different storage devices, and may exist, at least partially, merely as electronic signals on a system or network.

Furthermore, the described features, structures, or characteristics of the invention may be combined in any suitable manner in one or more embodiments. In the following description, numerous specific details are provided, such as examples of programming, software modules, user selections, components, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, components or operations are not shown or described in detail to avoid obscuring aspects of the invention.

The depicted order and labeled steps of the described logical flow charts are indicative of one embodiment of the presented process. Other steps and processes may be conceived that are equivalent in function, logic or effect to one or more steps, or portions thereof, of the illustrated process. Additionally, the format and symbols employed are provided to explain the logical steps of the process and are understood not to limit the scope of the process. Additionally, the order in which a particular process occurs may or may not strictly adhere to the order of the corresponding steps shown.

NOTATION

The notations $x(i)$, $x_1$ and $xi$ are used interchangeably to denote the components of a vector x. The following representations are used for a row vector x with n components $$x=[x(1)\, x(2)\ldots x(n)]=[x_1\, x_2\ldots x_n]=[x1\; x2\ldots xn]=x(1:n)$$

The following convention has been used to specify code constraints using Boolean operations. An "¯" (overbar) represents negation, multiplication represents AND, "+" (addition) represents OR, and "⊕" represents XOR (exclusive-or). Among these four operations, negation has the highest precedence, AND has the second highest precedence, OR (+) has the third highest precedence and XOR (⊕) has the lowest precedence. Only in very few exceptional cases, which are clearly stated herein, has the addition symbol "+" also been used to denote integer addition instead of the OR operation. No multiplication symbol has been used for AND; i.e., the product 'ab' represents "a AND b".

RLL encoder and decoder hardware based on Boolean logic is specified herein using the MATLAB notation for Boolean operations. In particular, "~" represents the unary operator negation, "&" represents the binary operator AND, "|" represents the binary operator OR, and "xor(.,.)" represents the function XOR (exclusive-or) with two binary arguments. Among these operators negation (~) has the highest precedence, AND (&) has the second highest precedence and OR (|) has the lowest precedence.

The class of maximum transition-run (MTR) codes, which require $1/(1 \oplus D)$ precoding, was introduced to eliminate the occurrence of likely error events at the output of the Viterbi detector. These codes satisfy k and j constraints at the input of a $1/(1 \oplus D)$ precoder. The k constraint limits the maximum runlength of zeros at the modulation encoder output (input of $1/1 \oplus D$) precoder) to k. The j constrain limits the maximum runlength of ones at the modulation encoder output (input of $1/(1 \oplus D)$ precoder) to j. In magnetic recording applications, the MTR code parameter j is typically equal to 2, 3 or 4 in order to eliminate likely error events at detector output whereas the code parameter k is usually much bigger in order to achieve the highest possible code rate and thus minimize rate loss. Time-varying MTR codes have a time-varying j-parameter profile that depends on the position within the codeword. They give code designers additional flexibility in terms of selecting the error events that will be prohibited and of achieving higher code rates.

Twins-constrained maximum-transition-run (TCMTR) codes that also require $1/(1 \oplus D)$ precoding have been proposed to offer an alternative to PRML (G,f) codes and to limit the path memory of Viterbi detectors in partial-response systems employing MTR codes. This class of codes satisfy three types of constraints, namely k and j constraints, and the twins constraint that limits the maximum number of consecutive twins (that is, a pair of zeros or a pair of ones) at the modulation encoder output (input of $1/(1 \oplus D)$ precoder) to t. The RLL code in Linear Tape Open (LTO) standards for generations 2 to 4 (hereinafter LTO 2-4) is a rate-16/17 TCMTR code that is based on a rate-8/9 "mother" code. It satisfies the constraints j=14, k=14 and t=11 at the input of the $1/(1 \oplus D)$ precoder and the VFO constraint. The M constraint (VFO constraint) at the input of a $1/(1 \oplus D^2)$ precoder is equivalent to the maximum runlength of alternating binary symbols a=M+1 at the input of a $1/(1 \oplus D)$ precoder. The rate-8/9 RLL mother code in LTO 2-4 satisfies an a constraint by removing two alternating 9-bit patterns, namely 010101010 and 101010101, from the list of $2^8=256$ allowable 9-bit codewords. In LTO 2-4, rate-8/9 encoded bytes are concatenated with uncoded bytes to obtain the rate-16/17 RLL code. The class of codes satisfying j, k, t and a constraints will be called TCMTR(j, k, t, a) codes. Using this notation the RLL code in LTO 2-4 can be described as a rate-16/17 TCMTR)j=14, k=14, t=11, a=24) code. In addition, each RLL codeword in LTO 2-4 has at least one isolated transition (NRZI pattern 010) to facilitate analog gain control prior to analog-to-digital conversion. Finally, the RLL code in LTO 2-4 rules out the low-transition-density sequences of Data Set Separator (DSS) and Resynchronization (Re Sync) patterns by ensuring that every 9-bit codeword in the list that defines the rate-8/9 mother code has at least two NRZI ones (two transitions).

Rate-32/33 or rate-48/49 PRML(G,I,M) codes have been proposed for modulation encoding of data in a synchronized codeword object (SCO). If both headers of an SCO are obtained by two-way interleaved RS encoding over GF(16), the use of rate-32/33 and rate-48/49 RLL codes for encoding SCO headers is not suitable, because these codes have an error propagation of 3 nibbles. In other words, a short channel error burst can cause 3 erroneous nibbles in an RS codeword over GF(16). Considering that the error correction capability of a 10-byte header with an 8-byte payload is only one nibble, a short channel error burst in this case is beyond the error correction capability of the RS code. Similarly, the use of the rate-16/17 LTO 2-4 RLL codes to encode two SCO headers is also not suitable, because this code has an error propagation of 2 nibbles, assuming again the same header ECC scheme of two-way interleaved RS encoding over GF(16). In this case, a short channel error burst can cause at most 2 erroneous nibbles in a RS codeword and a short channel error burst may again not be connected by the RS code.

FIG. 1 is a high level block diagram of a data storage system 100 in which the present invention may be implemented. The system 100 includes a rate-(s(K+1)/(s(K+1)+1) TCMTR(j,k,t,a) RLL encoder 200 which receives user data from a host 10. The encoder 200 encodes the data, as will be described herein, and passes the encoded data to a precoder 102 which may include write-equalization functionality as in LTO standards. A controller 104 receives the precoded data and transmits it to a write channel 106 which records the encoded data onto a data storage medium 20.

The storage system 100 further includes a read channel 108 which reads the data from the storage medium 20 and transmits it to the controller 104. The controller 104 sends the data to a detector 110 which processes (e.g., inverse precoding) and passes it on to a decoder 300. The decoder 300 decodes the data as will be described herein, and sends the decoded data to the host 10.

Figure 2:
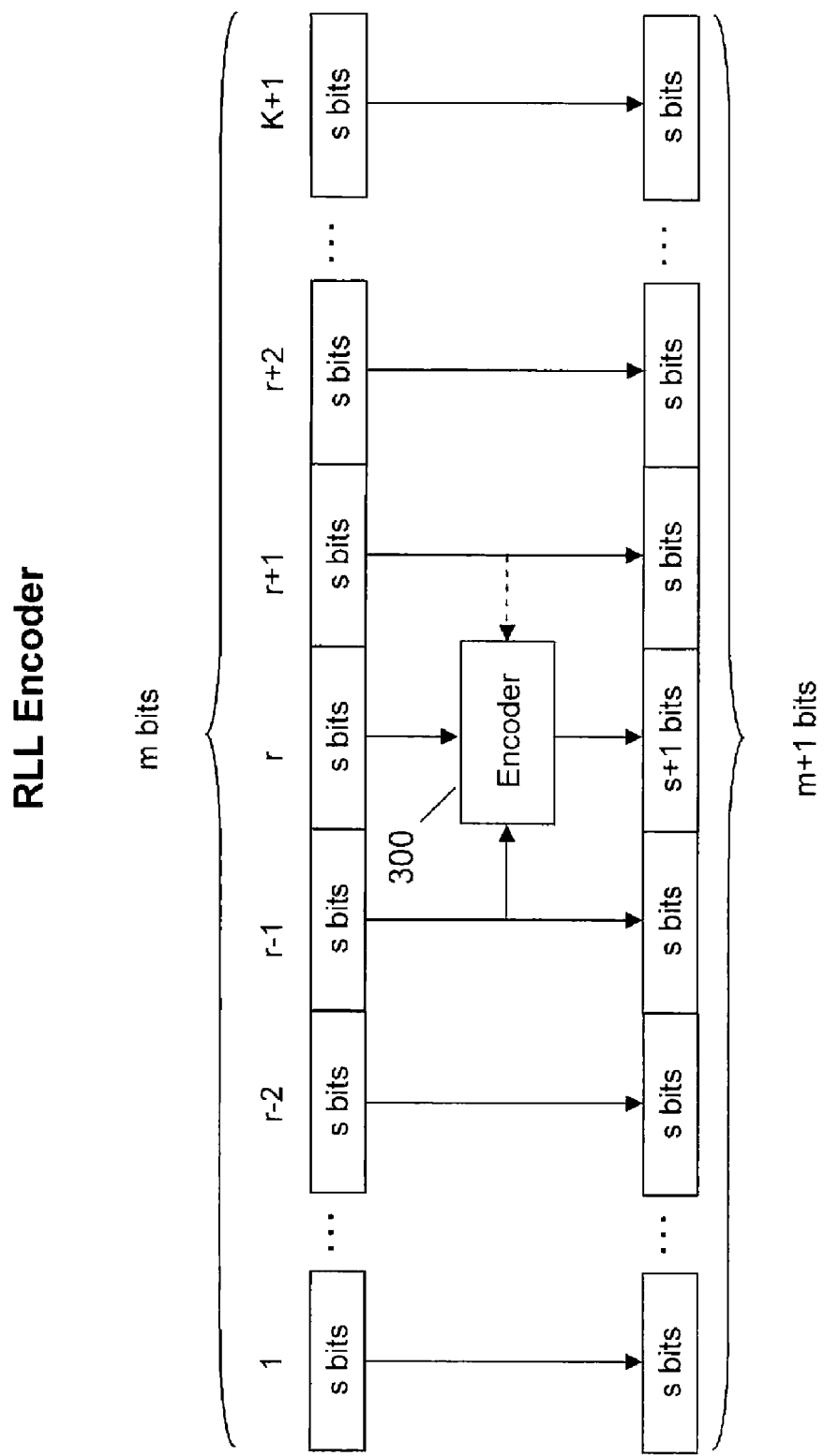
FIG. 2 is a diagram of an encoding process of the present invention.

FIG. 2 illustrates an input sequence of m-bits being encoded by the rate-(s(K+1)/(s(K+1)+1) TCMTR(j,k,t,a) RLL encoder 200 into an output sequence of m+1 bits in accordance with the present invention. The m-bit input sequence is divided into K+1 smaller blocks or symbols of s bits, which may, but does not necessarily have to, correspond to the ECC symbol size, such as four. One such symbol, the $r^{th}$ block in FIG. 2, is processed by the encoder 200 into s+1 bits while the remaining symbols, 1 to r−1 and r+1 to K+1, are unencoded. In order to prevent illegal bit sequences, at least the least bit of the $(r-1)^{th}$ (previous) symbol is also input into the encoder 200. In one code of the present invention, at least the first bit of the $(r+1)^{th}$ (next) symbol is also input into the encoder 200, indicated by the dashed arrow in FIG. 2. The $(r-1)^{th}$ symbol or the $(r+1)^{th}$ symbol is not necessarily part of the m-bit input sequence currently being processed. Rather, depending upon the location of the $r^{th}$ symbol within the current m-bit sequence, the $(r-1)^{th}$ symbol may be at the end of the previous m-bit sequence or the $(r-1)^{th}$ symbol may be at the beginning of the next m-bit sequence.

Figure 3:
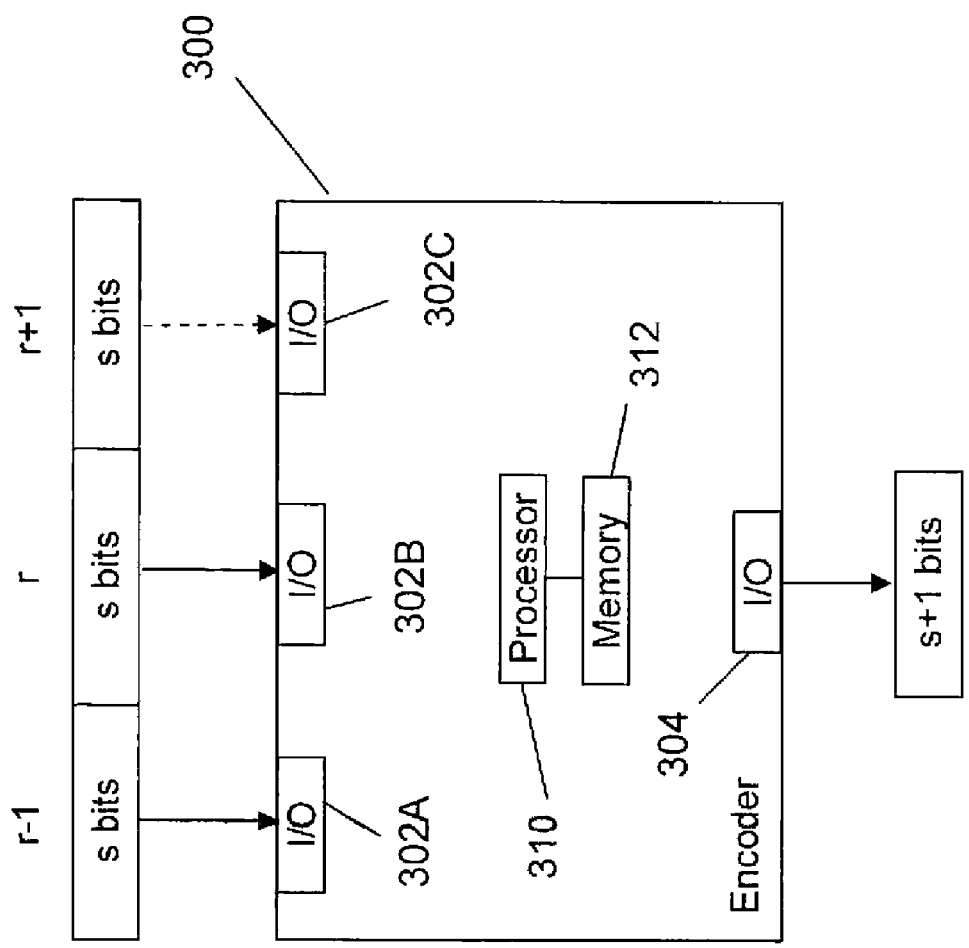
FIG. 3 is a block diagram of an encoder of the present invention.

FIG. 3 is a block diagram of an encoder 300 of the present invention. The encoder 300 includes input interfaces 302A, 302B, 302C through which the $(r-1)^{th}$, $r^{th}$ and $(r+1)^{th}$, symbols, respectively are received by the encoder 300. The encoder 300 also includes a processor 310 and associated memory 312 and an output interface 304 through which the encoded (s+1)-bit symbol may be output.

Figure 4:
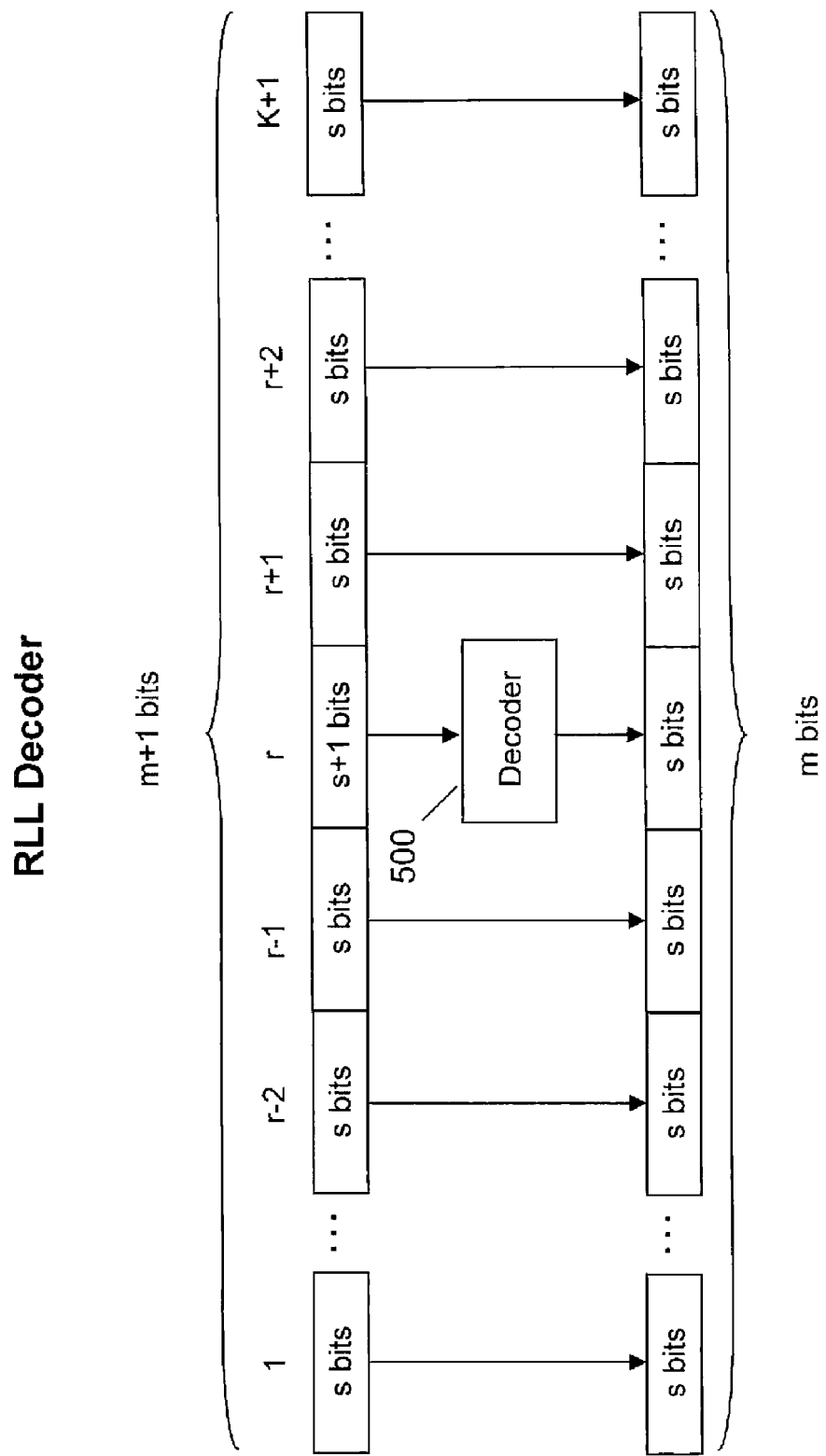
FIG. 4 is a diagram of a decoding process of the present invention.

FIG. 4 illustrates the corresponding decoding process using the decoder 500 of the present invention. The m+1 bit sequence is again divided into K symbols of s bits each and one symbol (the $r^{th}$ in FIG. 3) of s+1 bits. The $r^{th}$ symbol is decoded by the decoder 500 and interleaved with the unprocessed other symbols whereby the original m-bit sequence is output. Because no feedback or feedforward is employed in the decoding process, the decoder 500 may be a block decoder. An advantage of a block decoder is that an error in one symbol will not propagate to adjacent symbols.

Figure 5:
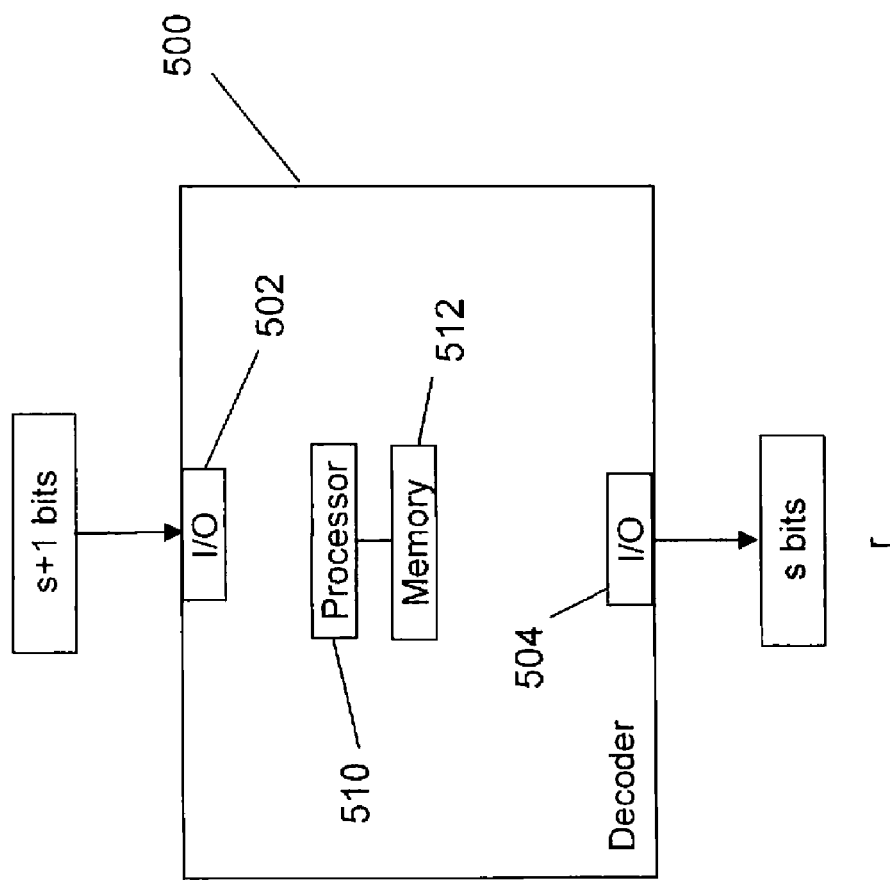
FIG. 5 is a block diagram of a decoder of the present invention.

FIG. 5 is a block diagram of a decoder 500 of the present invention. The encoder 500 includes an input interface 502 through which the encoded (s30 1)-bit symbol, read from the media, is received by the decoder 500. The decoder 500 also includes a processor 510 and associated memory 512 and an output interface 504 through which the decoded $r^{th}$ s-bit symbol may be output.

The processors 310, 510 may execute program instructions stored in the memories 312, 512 to generate the respective output symbols. It will be appreciated that the functions of the processor 310, 510 and memories 312, 512 may also be carried out by other hardware components, software modules or a combination of hardware and software. The present invention is not limited to the functions being carried out by any one particular means.

RATE-8/9 TCMTR(j=10, k=8, t=5, a=13) CODE (CODE 1)

Figure 6:
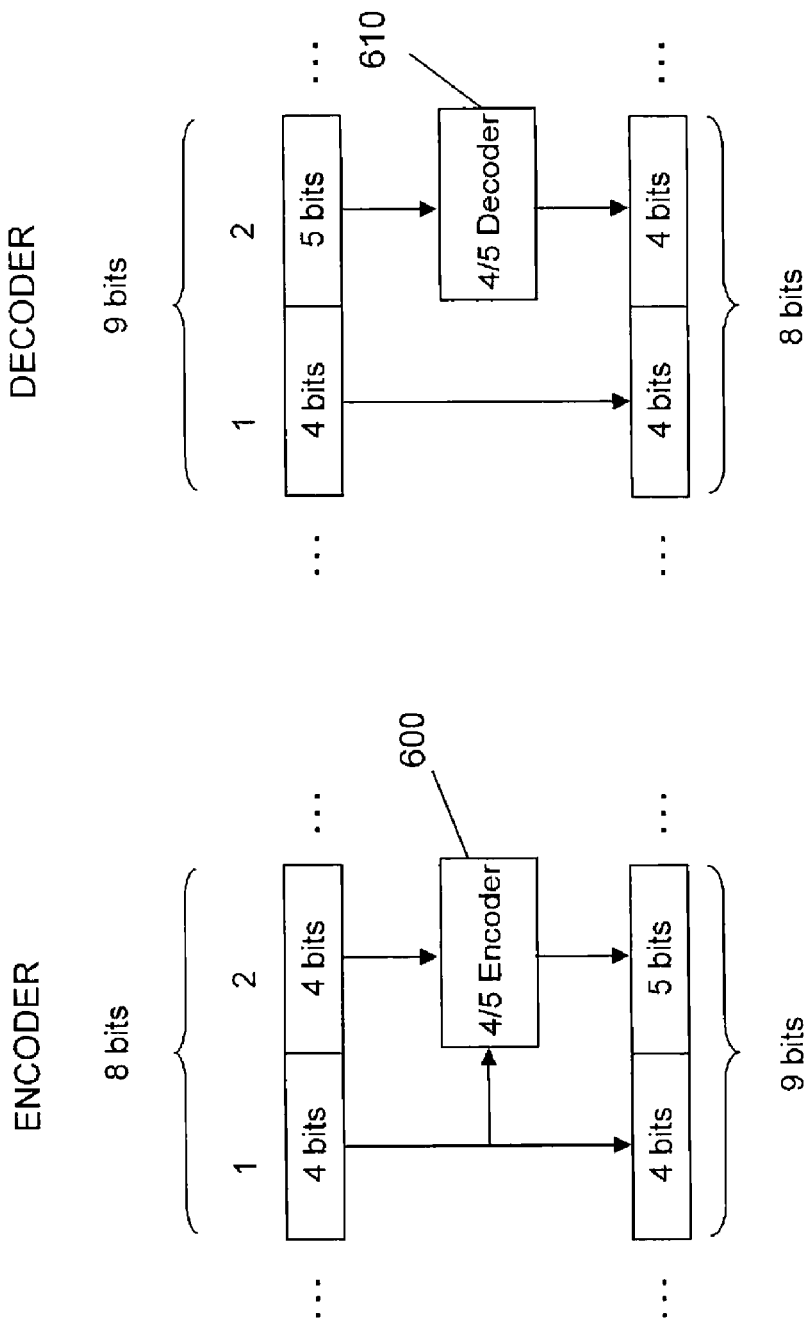
FIGS. 6A, 6B are block diagrams of an encoder and decoder, respectively, for a first code of the present invention.

FIGS. 6A and 6B illustrates a first embodiment of the present invention, an encoder (FIG. 6A) and decoder (FIG. 6B) for a rate-8/9 TCMTR(j=10, k=8, t=5, a=13) code that also enforces at least two transitions per codeword. The code may be used as a modulation code for RLL encoding of SCO headers that are RS encoded over $GF(2^4)$; i.e., ECC symbol size is s=4 bits and two-way interleaved. For this embodiment, m=8, q=2, K=1, r=2 and the number of adjacent symbols used for rate-4/5 encoding is 1. Furthermore, the error propagation is only one nibble, in other words, a short channel error burst can give rise to only one erroneous nibble in an RS codeword. Consequently, because the error correction capability associated with a 10-byte header which has an 8-byte payload is only one nibble, a short channel error burst in this case is within the error correction capability of the RS code.

The rate-8/9 TCMTR(j=10, k=8, t=5, a=13) code is based on a rate-4/5 TCMTR "mother" code that satisfies j constraint k constraint, t constraint and a constraint. Four out of eight input bits are mapped into five bits using this mother code. The remaining four input bits remain unchanged and are transferred directly to the output without being encoded. The five-bit codewords of the rate-4/5 TCMTR mother code not only depend on the four input bits but also depend on one adjacent unencoded bit, namely the past bit P preceding the 5-bit codewords of the mother code. In the following, the input of the rate-8/9 TCMTR encoder is assumed to be x(1:8) and the output is y(1:9). To minimize error propagation, the first four output bits are the same as the first four input bits; i.e., y(i)=x(i), i=1,2,3,4.

The encoded blocks y(5:9) of the rate-4/5 TCMTR mother code in conjunction with the adjacent bit P=y(4)=x(4) on which encoding depends satisfy the following set of constraints:

j constraint:

$$y_4 y_5 y_6 y_7 y_8 y_9 = 0$$

k constraint:

$$y_4 + y_5 + y_6 y_7 + y_8 + y_9 = 1$$

t constraint:

$$(y_4 \oplus y_5) + (y_6 \oplus y_7) + (y_8 \oplus y_9) = 1$$

$$(y_5 \oplus y_6) + (y_7 \oplus y_8) = 1$$

a constraint $$y_4 + \bar{y}_5 + y_6 + \bar{y}_7 + y_8 + \bar{y}_9 = 1$$

$$\bar{y}_4 + y_5 + \bar{y}_6 + y_7 + \bar{y}_8 + y_9 = 1$$

constraint ensuring encoded block gives rise to at least q=2 transitions after $1/(1 \oplus D)$ precoding (note that in the immediately following equation, "+" represents integer addition, not an OR operation):

$$y_4 + y_5 + y_6 + y_7 + y_8 + y_9 \geq q = 2$$

In the following description, codewords are grouped into lists and designated by capital letters where the size of the set is indicated in parentheses. For example, X(n) denotes a list of n codewords designated by X. In the case of P=x(4)=y(4)=0, there are exactly 16 codewords that satisfy the above set of j, k, t and a constraints, given by the list $Y_0(16)=\{00101, 01001, 01010, 01011, 01101, 01110, 10001, 10010, 10011, 10100, 10110, 10111, 11010, 11011, 11100, 11101\}$. In the case of P=x(4)=y(4)=1, there are exactly 20 codewords that satisfy the above set of constraints, given by the list $Y_1(20) = \{00010, 00011, 00100, 00101, 01000, 01001, 01011, 01100, 01101, 01110, 01111, 10001, 10010, 10100, 10101, 10110, 10111, 11010, 11011, 11101\}$.

The two sets $Y_0$ and $Y_1$ have 13 codewords in common; i.e., their intersection is the set $A(13)=Y_0(16) \cap Y_1(20)$ (where "∩" represents the binary set operator intersection). The remaining set of three codewords in $Y_0$ that are not in A are next defined; i.e., the set $B(3)=Y_0(16)\backslash A(13)=\{01010, 10011, 11100\}$, where \ is the set-theoretic difference. The bitwise complement of codewords in B(3) are in $Y_1$. The set of bitwise complements of codewords in B(3) will be denoted by $\overline{B}(3)=\{10101, 01100, 00011\} \Omega Y_1$. TABLE I illustrates one possible encoding table for the rate-4/5 TCMTR mother code. Datawords x(5:8) at the input of the encoder are denoted by decimal numbers. For example, the 4-bit data word 1011 corresponds to the decimal number 11. A specific dataword-to-codeword assignment has been assumed which is useful for compact representation of encoding and for demonstrating block encoding.

TABLE I

| P | Datawords | Codewords |
|---|---|---|
| 0 | 0-12 | A(13) |
| 0 | 13-15 | B(3) |
| 1 | 0-12 | A(13) |
| 1 | 13-15 | $\overline{B}(3)$ |

Table I has been specified to demonstrate that encoding for CODE 1 may be performed in a manner such that decoding of y(5:9) back into x(5:8) is independent of P, i.e., the decoder is preferably a block decoder in order to reduce error propagation.

Table II below specifies another possible encoding table that has been selected to implement an encoder for CODE 1 with Boolean logic. The 5-bit codewords that can be generated if P=0 or P=1 are exactly the same as the ones in Table I. However, the dataword-to-codeword assignment is different than in Table I in order to simplify implementation of the encoder and the decoder with Boolean logic. The codewords in B(3) and $\overline{B}(3)$ that depend on the unencoded bit P adjacent y(5:9) are in the third, tenth and fifteenth rows and are marked with an asterisk.

TABLE II

| Datawords | Codewords (P = 0) | Codewords (P = 1) |
|---|---|---|
| 0000 | 00101 | 00101 |
| 0001 | 01001 | 01001 |
| 0010 | 01010* | 10101* |
| 0011 | 01011 | 01011 |
| 0100 | 01101 | 01101 |
| 0101 | 01110 | 01110 |
| 0110 | 10001 | 10001 |
| 0111 | 10100 | 10100 |
| 1000 | 10010 | 10010 |
| 1001 | 10011* | 01100* |
| 1010 | 10110 | 10110 |
| 1011 | 10111 | 10111 |
| 1100 | 11010 | 11010 |
| 1101 | 11011 | 11011 |
| 1110 | 11100* | 00011* |
| 1111 | 11101 | 11101 |

It can be seen that the rate-8/9 TCMTR CODE 1 using the mother code in TABLE II satisfies the constraints j=10, k=8, t=5 and a=13 and ensures the presence of at least two transitions (NRZI ones) per codeword. Additionally, in TABLE II no 5-bit codeword is ever assigned to two different 4-bit datawords. Therefore, block decoding is possible, i.e., each 5-bit codeword may be assigned to a unique 4-bit dataword independent of the adjacent bit P.

For the rate -8/9 TCMTR(j=10, k=8, t=5, a=13) CODE 1, the encoding of 8-bits to 9-bits may be completely described by MATLAB Boolean operations. Eight bits x(1) . . . x(8) that are input to the encoder produce the output bits y(1) . . . y(9) at the encoder output. The following Boolean equations describe the encoder with an 8-bit input x and a 9-bit output y. An auxiliary Boolean variable a raises a flag whenever P=1 and the 4-bit input x(5:8) corresponds to one of the 5-bit codewords marked with an asterisk in TABLE II. This auxiliary Boolean variable a, in conjunction with an exclusive-or gate, is used for bitwise complementation of 5-bit codewords that are generated assuming P=0.

Auxiliary Boolean variable:

$a=x(4)\&(x(5)\&x(6)\&x(7)^*{\sim}x(8)|{\sim}x(5)\&{\sim}x(6)\&x(7)\&{\sim}x(8))$ Encoding output:

$y(1)=x(1)$ $y(2)=x(2)$ $y(3)=x(3)$ $y(4)=x(4)$ $y(5)=xor(a,x(5)|x(6)\&x(7))$ $y(6)=xor(a,(x(5)\&x(6)|{\sim}x(5)\&{\sim}x(6)\&x(7)|{\sim}x(5)\&{\sim}x(7)\&(x(6)x(8))))$ $y(7)=xor(a,(x(5)\&x(6)\&x(7)|x(5)\&{\sim}x(6)\&x(7)|{\sim}x(5)\&x(6)\&({\sim}x)(7)|x(7)|x(8)|{\sim}x(5)\&{\sim}x(6)\&{\sim}x(7)\&{\sim}x(8)))$ $y(8)=xor(a,(x(5)\&({\sim}x(6)|{\sim}x(7)|{\sim}x(5)\&xor(x(6),x(7)\&(x(7)|x(8))))$ $y(9)=xor(a,(x(5)\&x(6)\&x(8)|x(5)\&{\sim}x(6)\&x(8){\sim}x(5)\&x(6)\&{\sim}x(8)|{\sim}x(5)\&{\sim}x(6)\&({\sim}x(7)x(8))))$ The next set of Boolean equations describe an RLL decoder for CODE 1 with a 9-bit input w and an 8-bit output z. The RLL decoder inverts the mapping of the RLL encoder. As detection errors may occur, the output of the RLL decoder is not necessarily the same as the input of the RLL encoder. In the absence of detection errors though, the 8-bit RLL encoder input is equal to the 8-bit RLL decoder output; i.e., x=z.

Decoding output $z(1)=w(1)$ $z(2)=w(2)$ $z(3)=w(3)$ $z(4)=w(4)$ $z(5)=w(5)\&w(6)|w(5)\&w(8)|\sim w(6)\&\sim w(7)|\sim w(5)\&\sim w(8)\&\sim w(9)$ $z(6)=w(5)\&w(6)|w(5)\&\sim w(8)\&\sim w(9)|w(5)\&\sim w(7)\&\sim w(8)|\sim w(5)\&\sim xor(w(6)\&\sim w(7)\&(w(8)|w(9))$ $z(7)=w(5)\&\sim w(8)|w(5)\&\sim w(6)\&w(7)|\sim w(5)\&w(8)\&w(9)|\sim w(5)\&w(6)\&\sim w(7)\&w(8)$ $z(8)=w(5)\&w(8)\&w(9)|w(5)\&w(7)\&\sim w(8)\&\sim(xor(w(6),w(9)))|\sim w(5)\&w(6)\&\sim w(7)\&w(9)|\sim w(5)\&w(6)\&w(7)\&\sim w(9)$ The rate-8/9 TCMTR(j=10, k=8, t=5, a=13) CODE 1 of the encoder and decoder provided by the present invention gives rise to at least two transitions per codeword. This code can be used as a modulation code for RLL encoding of SCO headers that are obtained by two-way interleaving of two RS codewords with an ECC symbol size of s=4 bits (one nibble). For this code, m=8 and the number of adjacent bits used for generating 5-bit codewords of the rate-4/5 mother code is one. Furthermore, the error propagation is only one nibble. Thus, a short error burst at the output of the detector can give rise to only one erroneous nibble in an RS codeword. The error correction capability of a 10-byte header which has an 8-byte payload is only one nibble. Consequently, a short channel error burst is within the error connection capability of the RS code.

RATE-16/17 TCMTR(j=14, k=14, t=10, a=22) CODE (CODE 2)

Figure 7:
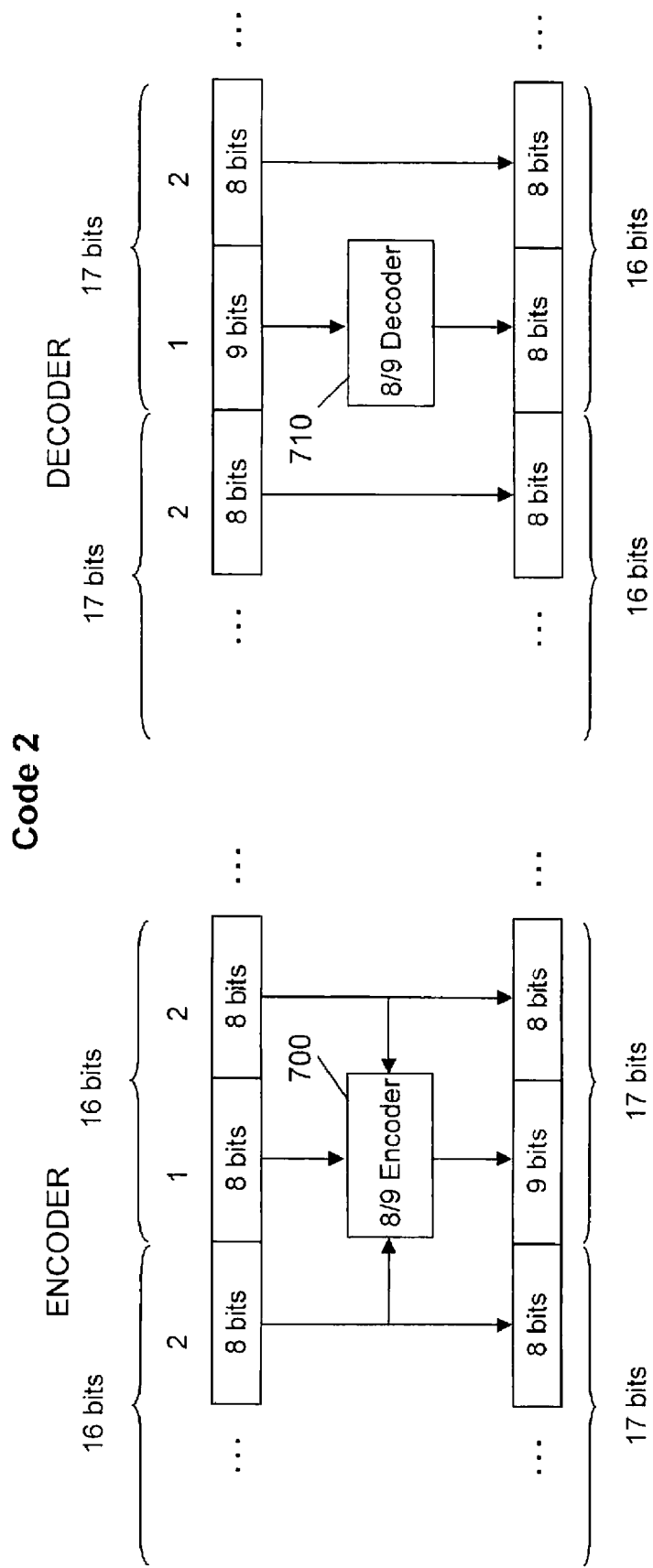
FIGS. 7A, 7B are block diagrams of an encoder and decoder, respectively, for a second code of the present invention.

FIGS. 7A and 7B illustrates a second embodiment of the present invention, an encoder (FIG. 7A) and decoder (FIG. 7B) for a rate-16/17 TCMTR(j=14, k=14, t=10, a=22) code is provided that increases robustness to channel errors by preventing likely error events from occurring at selected locations. CODE 2 also enforces at least one isolated peak per codeword and has at least two transitions per codeword. CODE 2 may be used as a modulation code for RLL encoding of SCO headers that are RS encoded over $GF(2^8)$; i.e., ECC symbol size is s=8 bits. For this embodiment, m=16, q=2, K=1, r=1 and the number of adjacent symbols used for rate-8/9 encoding is two for this embodiment. Furthermore, the error propagation is two bytes. In other words, a short channel error burst can give rise to two erroneous bytes in an RS codeword. If the header size is increased to 12 bytes without changing the header payload size of 8 bytes, a short channel error burst would be within the error correction capability of the RS code. The rate-16/17 TCMTR(j=14, k=14, t=10, a=22) CODE 2 provided by the second embodiment is significantly better than the rate-16/17 TCMTR(j=14, k=14, t=11, a=24) LTO 2-4 code because it satisfies tighter code constraints and is more robust to channel errors with only a slight increase in the complexity required to implement the RLL encoder and decoder.

The rate-16/17 TCMTR(j=14, k=14, t=10, a=22) CODE 2 is based on a rate-8/9 TCMTR mother code that satisfies j constraint, k constraint, t constraint and a constraint. In addition, the rate-8/9 TCMTR mother code ensures that there is at least one isolated peak per codeword and enforces at least two transitions per codeword in order to rule out DSS and Re Sync pattern. Finally, the code improves robustness to errors by eliminating likely error events at detector output. The final code property is achieved by imposing a time-varying j profile.

Eight out of sixteen input bits are mapped into nine bits using this mother code. The remaining eight input bits remain unchanged and are transferred to the output unencoded. The nine-bit codewords of the rate-8/9 TCMTR mother code not only depend on the eight input bits but also on two adjacent unencoded bits, namely the past bit P preceding the 9-bit codewords of the mother code (feedback) and the future bit F following the 9-bit codewords (feedforward). In the following description, the input of the rate-16/17 TCMTR encoder is assumed to be x(1:16) and the output is y(1:17). To minimize error propagation, the last eight output bits are the same as the last eight input bits, i.e., y(i+1)=x(i), i=9, . . . , 16. Furthermore the previous input of the rate-16/17 TCMTR encoder is assumed to be x'(1:16) and the previous output is y(1:17). The time-varying j constraints that are imposed are j=3 at y(4) (n=4), j=2 at y(5) (n=5), and j=3 at y(7) (n=7). Therefore, the j profile is given by j(n)=[3 2 3 2 3] for bit positions n=[4 5 6 7 8].

The encoded blocks y(1:9) of the rate-8/9 TCMTR mother code in conjunction with two adjacent bits P=y'(17)=x'(16) and F=y(10)=x(9) on which encoding depends satisfy the following set of constraints in the case of P=0, and F=0:

j constraint:

$y_3 y_4 y_5 = 0$ $y_5 y_6 y_7 = 0$ $y_1 y_2 y_3 y_4 = 0$ k constraint:

$y_1 + y_2 + y_3 + y_4 = 1$ $y_6 + y_7 + y_8 + y_9 = 1$ t constraint:

$(y_1 \oplus y_2) + (y_3 \oplus y_4) + (y_5 \oplus y_6) + (y_7 \oplus y_8) = 1$ $y_1 + (y_2 \oplus y_3) + (y_4 \oplus y_5) + (y_6 \oplus y_7) = 1$ $(y_2 \oplus y_3) + (y_4 \oplus y_5) + (y_6 \oplus y_7) + (y_8 \oplus y_9) = 1$ a constraint:

$\bar{y}_1 + y_2 + \bar{y}_3 + y_4 + \bar{y}_5 + y_6 + \bar{y}_7 + y_8 = 1$ $y_2 + \bar{y}_3 + y_4 + \bar{y}_5 + y_6 + \bar{y}_7 + y_8 + \bar{y}_9 = 1$ constraining on encoded block to enforce at least two transitions after $1/(1 \oplus D)$ precoding (note that in the immediately following equation, "+" represents integer addition, not the OR operation):

$y_1 + y_2 + y_3 + y_4 + y_5 + y_6 + y_7 + y_8 + y_9 \geq 2$ constraining on encoded block to ensure at least one isolated peak:

$y_1 \bar{y}_2 + \bar{y}_1 y_2 \bar{y}_3 + \bar{y}_2 y_3 \bar{y}_4 + \bar{y}_3 y_4 \bar{y}_5 + \bar{y}_4 y_5 \bar{y}_6 + \bar{y}_5 y_6 \bar{y}_7 + \bar{y}_6 y_7 \bar{y}_8 + \bar{y}_7 y_8 \bar{y}_9 + \bar{y}_8 y_9 = 1$ The set of 9-bit codewords that satisfy the above set of constraints will be denoted by $Y_0$. There are exactly 270 codes in $Y_0$(270).

The encoded blocks y(1:9) of the rate-8/9 TCMTR mother code in conjunction with two adjacent bits P=y'(17)=x'(16) and F=y(10)=x(9) on which encoding depends satisfy the following set of constraints in the case of P=0 and F=1:

j constraint:

$y_3 y_4 y_5 = 0$ $y_5 y_6 y_7 = 0$ $y_1 y_2 y_3 y_4 = 0$ $y_6 y_7 y_8 y_9 = 0$ k constraint:

$y_1+y_2+y_3+y_4=1$ t constraint:

$(y_1 \oplus y_2)+(y_3 \oplus y_4)+(y_5 \oplus y_6)+(y_7 \oplus y_8)=1$ $y_1+(y_2 \oplus y_3)+(y_4 \oplus y_5)+(y_6 \oplus y_7)=1$ $(y_2 \oplus y_3)+(y_4 \oplus y_5)+(y_6 \oplus y_7)+(y_8 \oplus y_9)=1$ a constraint:

$\bar{y}_1+\bar{y}_2+y_3+y_4+\bar{y}_5+y_6\bar{y}_7+y_8=1$ $\bar{y}_2+y_3+\bar{y}_4+y_5+\bar{y}_6+y_7+\bar{y}_8+y_9=1$ constraint on encoded block to enforce at least two transitions after $1/(1 \oplus D)$ precoding (note that in the immediately following equation, "+" integer addition and not OR operation):

$y_1+y_2+y_3+y_4+y_5+y_6+y_7+y_8+y_9 \geq 1$ constraint on encoded block to ensure at least one isolated peak:

$y_1 y \bar{y}_2+\bar{y}_1 y_2 \bar{y}_3+\bar{y}_2 y_3 \bar{y}_4+\bar{y}_3 y_4 \bar{y}_5+\bar{y}_4 y_5 \bar{y}_6+\bar{y}_5 y_6 \bar{y}_7+\bar{y}_6 y_7 \bar{y}_8+ \bar{y}_7 y_8 y_9=1$ The set of 9-bit codewords that satisfy the above set of constraints will be denoted by $Y_1$. There are exactly 266 codewords in $Y_1$(266).

The encoded blocks y(1:9) of the rate-8/9 TCMTR mother code in conjunction with two adjacent bits P=y'(17)=x'(16) and F=y(10)=x(9) on which encoding depends satisfy the following set of constraints in the case of P=1 and F=0;

j constraint:

$y_3 y_4 y_5=0$ $y_5 y_6 y_7=0$ $y_1 y_2 y_3 y_4=0$ k constraint:

$y_6+y_7+y_8+y_9=1$ t constraint:

$(y_1 \oplus y_2)+(y_3 \oplus y_6)+(y_5 \oplus y_6)+(y_7 \oplus y_8)=1$ $\bar{y}_1+(y_2 \oplus y_3)+(y_4 \oplus y_5)+(y_6 \oplus y_7)=1$ $(y_2 \oplus y_3)+(y_4 \oplus y_5)+(y_6 \oplus y_7)+(y_8 \oplus y_9)=1$ a constraint:

$y_1+\bar{y}_2+y_3+\bar{y}_4+y_5+\bar{y}_6+y_7+\bar{y}_8=1$ $y_2+\bar{y}_3 y_4+\bar{y}_5+y_6+\bar{y}_7+y_8+\bar{y}_9=1$ constraint on encoded block to enforce at least two transitions after $1/(1 \oplus D)$ precoding (note that in the immediately following equation, "+" integer addition and not OR operation):

$y_1+y_2+y_3+y_4+y_5+y_6+y_7+y_8+y_9 \geq 1$ constraint on encoded block to ensure at least one isolated peak:

$\bar{y}_1 y_2 \bar{y}_3+\bar{y}_2 y_3 \bar{y}_4+\bar{y}_3 y_4 \bar{y}_5+\bar{y}_4 y_5 \bar{y}_6+\bar{y}_5 y_6 \bar{y}_7+\bar{y}_6 y_7 \bar{y}_8+\bar{y}_7 y_8 \bar{y}_9 =1$ The set of 9-bit codewords that satisfy the above set of constraints will be denoted by $Y_2$. There are exactly 267 codewords in $Y_2$(267).

The encoded blocks y(1:9) of the rate-8/9 TCMTR mother code in conjunction with two adjacent bits p=y'(17)=x'(16) and F=y(10)=x(9) on which encoding depends satisfy the following set of constraints in the case of P=1 and F=1;

j constraint:

$y_3 y_4 y_5=0$ $y_5 y_6 y_7=0$ $y_1 y_2 y_3 y_4=0$ $y_6 y_7 y_8 y_9=0$ t constraint:

$(y_1 \oplus y_2)+(y_3 \oplus y_4)+(y_5 \oplus y_6)+(y_7 \oplus y_8)=1$ $\bar{y}_1+(y_2 \oplus y_3)+(y_4 \oplus y_5)+(y_6 \oplus y_7)=1$ $(y_2 \oplus y_3)+(y_4 \oplus y_5)+(y_6 \oplus y_7)+(y_8 \oplus y_9)=1$ a constraint:

$y_1+\bar{y}_2+y_3+\bar{y}_4+y_5+\bar{y}_6+y_7+\bar{y}_8=1$ $\bar{y}_2+y_3+\bar{y}_4+y_5+\bar{y}_6+y_7+\bar{y}_8+y_9=1$ constraint on encoded block to enforce at least two transitions after $1/(1 \oplus D)$ precoding (note that in the immediately following equation, "+" represents integer addition and not OR operation):

$y_1+y_2+y_3+y_4+y_5+y_6+y_7+y_8+y_9 \geq 0$ constraint on encoded block to ensure at least one isolated peak:

$\bar{y}_1 y_2 \bar{y}_3+\bar{y}_2 y_3 \bar{y}_4+\bar{y}_3 y_4 \bar{y}_5+\bar{y}_4 y_5 \bar{y}_6+\bar{y}_5 y_6 \bar{y}_7+\bar{y}_6 y_7 \bar{y}_8+\bar{y}_7 y_8$ $\bar{y}_9=1$ Note that because of P=1 and F=1, it is not necessary to impose a k constraint. Furthermore, as q=2 and the encoded block is preceded by a transition (P=1, NRZI notation) and followed by a transition (F=1, NRZI notation), there is no need to enforce additional transitions. However, the other constraints ensure that there is at least one more transition per codeword, increasing the minimum number of transitions associated with a codeword in this case (P=1 and F=1) to three. The set of 9-bit codewords that satisfy the above set of constraints will be denoted by $Y_3$. There are exactly 260 codewords in $Y_3$(260). The various types of intersections among the four lists of codewords $Y_0, Y_1, Y_2$, and $Y_3$ are next defined in order to specify an encoding table for the rate-8/9 TCMTR mother code.

There are 224 codewords that are common to all four lists of 9-bit codewords $Y_0, Y_1, Y_2$, and $Y_3$. Table III (FIG. 8) depicts the list of 224=28*8 codewords, which will be denoted by A(224), in a matrix of 28 rows and 8 columns.

There are 17 codewords that are in $Y_0$ and $Y_2$ but not in $Y_1$ and $Y_3$. Table IV (FIG. 9) depicts only the first 16 of these codewords in a list denoted by B(16). The last codeword that is not shown in Table IV is {111011001}.

There are 16 codewords that are in $Y_1$ and $Y_3$ but not in $Y_0$ and $Y_2$. Table V (FIG. 10) depicts all 16 of these codewords in a list denoted by C(16).

There are 21 codewords that are in $Y_0$ and $Y_1$ but not in $Y_2$ and $Y_3$. Table VI (FIG. 11) depicts only the first 16 of these codewords in a list denoted by D(16). The remaining five codewords that are not shown in Table VI are {101100110, 101100111, 101101100, 101101110, 111000010}.

And, there are 18 codewords that are in $Y_2$ and $Y_3$ but not in $Y_0$ and $Y_1$. Table VII (FIG. 12) depicts only the first 16 of these codewords in a list denoted by E(16). The remaining two codewords that are not shown in TABLE VII are {011000010, 1091010100}.

TABLE VIII below shows an encoding table for the rate-8/9 TCMTR mother code. Datawords x(1:8) at the input of the encoder are denoted by decimal numbers 0-255. For example, the 8-bit data word 10001011 corresponds to the decimal number 139. A specific dataword-to-codeword assignment has been assumed that is useful for compact representation of encoding. Other selections of codewords and other dataword-to-codeword assignments are possible. Note that a specific 9-bit codeword is never assigned to two different 8-bit datawords. Therefore, block decoding is possible, i.e., each 9-bit codeword can be assigned to a unique 8-bit dataword independent of the adjacent bits P and F.

TABLE VIII

| P | F | Datawords | Codewords |
|---|---|-----------|-----------|
| 0 | 0 | 0-223     | A(224)    |
| 0 | 0 | 224-239   | B(16)     |
| 0 | 0 | 240-255   | D(16)     |
| 0 | 1 | 0-223     | A(224)    |
| 0 | 1 | 224-239   | C(16)     |
| 0 | 1 | 240-255   | D(16)     |
| 1 | 0 | 0-223     | A(224)    |
| 1 | 0 | 224-239   | B(16)     |
| 1 | 0 | 240-255   | E(16)     |
| 1 | 1 | 0-223     | A(224)    |
| 1 | 1 | 224-239   | C(16)     |
| 1 | 1 | 240-255   | E(16)     |

RATE-16/17 TCMTR($j$=18, $k$=16, $t$=9, $a$=21) CODE  (CODE 3)

Figures 13A, 13B:
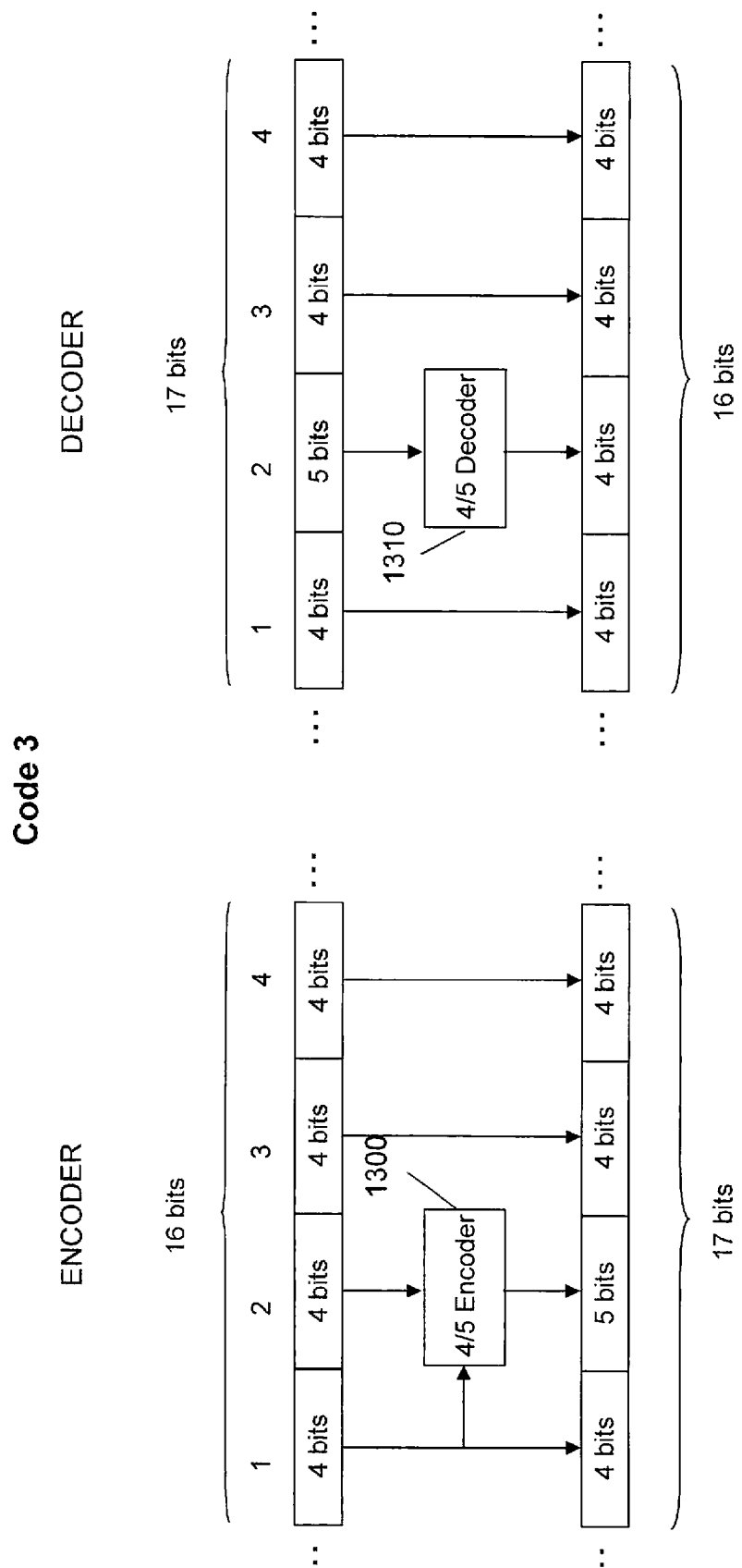
FIGS. 13A, 13B are block diagrams of an encoder and decoder, respectively, for a third code of the present invention.

FIGS. 13A and 13B illustrates a third embodiment of the present invention, an encoder (FIG. 13A) and decoder (13B) for a rate-16/17 TCMTR($j$=18, $k$=16, $t$=9, $a$=21) code is provided that also enforces at least two transitions per codeword. CODE 3 may be used as a modulation code for RLL encoding of SCO headers that are RS encoded over GF($2^4$): i.e., ECC symbol size is $s$=4 bits and two-way interleaved. For this embodiment, m=16, q=2, K=3, r=2 and the number of adjacent symbols used for rate-4/5 encoding is 1. Furthermore, the error propagation is only one nibble. In other words, a short channel error burst can give rise to only one erroneous nibble in an RS codeword.

The rate-16/17 TCMTR(j32 18, k=16, t=9, a=21) CODE 3 is based on the same rate-4/5 TCMTR mother code that was used for CODE 1. In this case, m=16, K=3, r=2 i.e, three unencoded s=4 bit symbols (nibbles) are interleaved together with the encoded 5-bit block. Using CODE 3, a high code rate of 16/17 (high format efficiency) may be achieved. If a two-way interleaved header ECC with 4-bit symbols is used, error propagation as a result of a likely error event at decoder output (2-5 NRZI bits long) is at most one nibbler per RS codeword and the code constraints are similar to the rate-16/17 LTO 2-4 code.

It is important to note that while the present invention has been described in the context of fully functioning encoding and decoding systems, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs and transmission-type media.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for encoding/decoding a data input sequence of m bits into an output sequence codeword of m+1 bits, or a method for deploying computing infrastructure comprising integrating computer readable code into a computing system for encoding/decoding a data input sequence of m bits into an output sequence codeword of m+1 bits.

What is claimed is:

1. A method for encoding a data input sequence of m bits into an output sequence codeword of m+1 bits, where m is an integer multiple of an ECC symbol size s, the method comprising the steps of:
   receiving a data stream of unencoded m-bit input sequences, including a first m-bit input sequence;
   dividing each m-bit input sequence into a first block of s bits and at least one second block of (m-s) unencoded bits;
   in response to at least one of the second blocks of (m-s) unencoded bits adjacent the first block of s bits of the first m-bit input sequence, encoding the first block of s bits of the first m-bit input sequence into an encoded block of s+1 of the first m-bit input sequence, wherein the encoded block of s+1 bits of the first m-bit input sequence in conjunction with adjacent unencoded blocks satisfies a j constraint, a k constraint and a t constraint and the encoded block of s+1 bits of the first m-bit input sequence gives rise to at least q transitions after $1/(1 \oplus D)$, precoding:
   interleaving the encoded block of s+1 bits of the first m-bit input sequence among (m/s-1) unencoded blocks of the first m-bit input sequence to generate an (m+1)-bit output sequence codeword;
   precoding the (m+1)-bit output sequence codeword with a $1/(1 \oplus D)$ precoder; and
   storing the precoded output sequence codeword on a data storage medium.

2. The method of claim 1, wherein the at least one of the second blocks of (m−s) unencoded bits adjacent the first block of s bits of the first m-bit input sequence is within the first m-bit input sequence.

3. The method of claim 1, wherein the at least one of the second blocks of (m−s) unencoded bits adjacent the first block of s bits of the first m-bit input sequence is at the end of a previous m-bit input sequence.

4. The method of claim 1, wherein the at least one of the second blocks of (m−s) unencoded bits adjacent the first block of s bits of the first m-bit input sequence is at the beginning of a next m-bit input sequence.

5. The method of claim 1, wherein encoding the first block of s bits of the first m-bit input sequence comprises encoding the first block of bits of the first m-bit input sequence with a rate-(s(K+1)/(s(K+1)+1) TCMTR(j,k,t,a) code.

6. The method of claim 5, wherein the rate-(s)(K+1)/(s(K+1)+1) TCMTR(j,k,t,a) code comprises a rate-8/9 TCMTR (j=10, k=8, t=5, a=13) code.

7. The method of claim 5, wherein the rate-(s(K+1)/(s(K+1)+1) TCMTR(j,k,t,a) code comprises a rate-16/17 TCMTR (j=14, k=14, t=10, a=22) code.

8. The method of claim 5, wherein the rate-(s(K+1))/s(K+1)+1) TCMTR(j,k,t,a) code comprises a rate-16/17 TCMTR (j=18, k=16, t=9, a=21) code.

* * * * *